(12) United States Patent
Heid

(10) Patent No.: US 9,000,738 B2
(45) Date of Patent: Apr. 7, 2015

(54) HIGH-FREQUENCY SUPPLY OF A LOAD WITHOUT IMPEDANCE MATCHING

(75) Inventor: Oliver Heid, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 257 days.

(21) Appl. No.: 13/580,526

(22) PCT Filed: Jan. 31, 2011

(86) PCT No.: PCT/EP2011/051278
§ 371 (c)(1),
(2), (4) Date: Aug. 22, 2012

(87) PCT Pub. No.: WO2011/101226
PCT Pub. Date: Aug. 25, 2011

(65) Prior Publication Data
US 2012/0313596 A1 Dec. 13, 2012

(30) Foreign Application Priority Data
Feb. 22, 2010 (DE) .......................... 10 2010 008 777

(51) Int. Cl.
*H02M 1/088* (2006.01)
*H05H 1/46* (2006.01)
(Continued)

(52) U.S. Cl.
CPC ................. *H05H 1/46* (2013.01); *H02M 1/088* (2013.01); *H02M 3/1584* (2013.01); *H02M 11/00* (2013.01);
(Continued)

(58) Field of Classification Search
CPC .... H02M 1/088; H02M 3/1584; H02M 11/00
USPC .................... 323/230, 371; 363/178
See application file for complete search history.

(56) References Cited

U.S. PATENT DOCUMENTS

| 4,633,141 A | 12/1986 | Weber | 315/307 |
| 4,994,760 A | 2/1991 | Roehrs | 330/295 |

(Continued)

FOREIGN PATENT DOCUMENTS

| CN | 1342340 A | 3/2002 | H01J 37/32 |
| DE | 10257147 A1 | 2/2004 | H01J 37/32 |

(Continued)

OTHER PUBLICATIONS

Wang, Jun; Characterization, Modeling, and Application of 10-kV SiC MOSFET, Aug. 2008, IEEE Transaction on Electron Devices, vol. 55, No. 8, pp. 1798-1806.*

(Continued)

*Primary Examiner* — Harry Behm
(74) *Attorney, Agent, or Firm* — King & Spalding L.L.P.

(57) ABSTRACT

An energy supplying device for a load has a direct current source, a number of switching stages, and a control device. The switching stages are connected to the direct current source, the load, and the control device such that the control device can drive the switching stages to selectively connect the load to the direct current source. Each switching stage has a field effect transistor and a number of freewheeling diodes connected in opposition to the respective field effect transistor in parallel. The field effect transistors have a maximum operational threshold frequency. Each freewheeling diode has a recovery time. For each switching stage, the recovery times of the respective freewheeling diodes correspond with the reciprocal value of the threshold frequency of the respective field effect transistor. The control device controls the switching stages at least intermittently such that power is reflected back into the switching stages on the basis of a mismatch.

12 Claims, 3 Drawing Sheets

(51) Int. Cl.
*H01J 37/32* (2006.01)
*H03F 3/217* (2006.01)
*H02M 3/158* (2006.01)
*H02M 11/00* (2006.01)

(52) U.S. Cl.
CPC ..... *H01J 37/32009* (2013.01); *H01J 37/32027* (2013.01); *H01J 37/32045* (2013.01); *H03F 3/2178* (2013.01)

(56) References Cited

U.S. PATENT DOCUMENTS

| | | | |
|---|---|---|---|
| 5,818,170 A * | 10/1998 | Kikunaga et al. | 315/5 |
| 6,469,919 B1 | 10/2002 | Bennett | 363/56.02 |
| 7,130,202 B2 * | 10/2006 | Yang | 363/44 |
| 7,778,054 B2 * | 8/2010 | Sasaya et al. | 363/56.01 |
| 2004/0032212 A1 | 2/2004 | Yuzurihara et al. | 315/111.81 |
| 2004/0114399 A1 | 6/2004 | Lincoln et al. | 363/56.02 |
| 2009/0117288 A1 | 5/2009 | Gluck et al. | 427/569 |
| 2009/0128101 A1 * | 5/2009 | Skinner | 323/220 |
| 2009/0278513 A1 | 11/2009 | Bahramian et al. | 323/217 |
| 2010/0117095 A1 * | 5/2010 | Zhang | 257/76 |
| 2012/0313596 A1 | 12/2012 | Heid | 323/271 |

FOREIGN PATENT DOCUMENTS

| | | | | |
|---|---|---|---|---|
| EP | 1272014 A1 | 1/2003 | | H01J 37/32 |
| JP | 62502009 A | 8/1987 | | G09G 3/12 |
| JP | 2003524361 A | 8/2003 | | H01J 37/32 |
| JP | 2008017237 A | 1/2008 | | H03K 17/16 |
| WO | 2008/050619 A1 | 5/2008 | | H02M 3/28 |
| WO | 2011/101226 A2 | 8/2011 | | |

OTHER PUBLICATIONS

Wang, Jun; Characterization, Modeling of 10-kV SiC JBS Diodes and their Application Prospect in X-Ray Generators; IEEE Energy Conversion Congress and Exposition (ECCE), Sep. 2009, pp. 1488-1493.*
Heid, O. et al., "Compact Solid State Direct Drive RF LINAC," Proceedings of IPAC'10, Kyoto, Japan, 3 pages, Aug. 2010, pp. 4278-4280.
German Office Action, Application No. 10 2010 008 777.7-54, 6 pages, Nov. 8, 2010.
International Search Report and Written Opinion, Application No. PCT/EP2011/051278, 20 pages, Apr. 20, 2012.
Japanese Office Action, Application No. 2012554260, 3 pages, Oct. 22, 2013.
Chinese Office Action, Application No. 2011800104537, 11 pages, Jul. 29, 2014.

* cited by examiner

HIGH-FREQUENCY SUPPLY OF A LOAD WITHOUT IMPEDANCE MATCHING

CROSS-REFERENCE TO RELATED APPLICATIONS

This application is a U.S. National Stage Application of International Application No. PCT/EP2011/051278 filed Jan. 31, 2011, which designates the United States of America, and claims priority to DE Patent Application No. 10 2010 008 777.7 filed Feb. 22, 2010. The contents of which are hereby incorporated by reference in their entirety.

TECHNICAL FIELD

The present disclosure relates to a power supply device for a load,
  wherein the power supply device has a DC voltage source, a number of switching stages and a control device,
  wherein the switching stages are connected to the DC voltage source, the load and the control device, such that the load can be connected to the DC voltage source on account of a corresponding driving of the switching stages by the control device,
  wherein the switching stages in each case have a field effect transistor and a number of freewheeling diodes reverse-connected in parallel with the respective field effect transistor,
  wherein the field effect transistors have a cut-off frequency up to which they can maximally be operated,
  wherein each freewheeling diode has a recovery time.

BACKGROUND

Power supply devices of this type are generally known.

The cut-off frequency is that frequency which the field effect transistor can still just switch. The freewheeling diode is not taken into account in the context of determining the cut-off frequency. The cut-off frequency is an intrinsic property of the field effect transistor. The recovery time of the freewheeling diode is that time which elapses after the turn-off of a voltage directed in the forward direction to the freewheeling diode until the blocking effect of the diode is established again. The recovery time is an intrinsic property of the freewheeling diode.

In conventional power supply devices, a MOSFET is typically used as field effect transistor. In the case of a plurality of MOSFETs connected in parallel, in addition a high-frequency combiner is furthermore required.

Conventional MOSFETs have an intrinsic body diode as freewheeling diode, that is to say a diode integrated into the respective MOSFET. Said intrinsic body diode generally has a relatively long recovery time. The time is generally considerably greater than the reciprocal of the cut-off frequency of the MOSFET. In conventional devices, therefore, care has to be taken to ensure that the operating frequency of the field effect transistor remains low enough that its reciprocal is above the recovery time of the freewheeling diode. Alternatively or additionally, a corresponding matching circuit (for example a so-called circulator) has to be used to ensure that reflection of power back to the switching stages is avoided. Otherwise, the switching stage would be destroyed.

In the case where a plurality of switching stages are connected in parallel, the design of the matching circuit turns out to be extremely complex. This holds true especially in the case of pulsed operation of the load, during which reflections have to be avoided in a wide frequency spectrum. In such a case, the power supply device overall turns out to be correspondingly complex and expensive.

SUMMARY

In one embodiment, a power supply device for a load is provided, wherein the power supply device has a DC voltage source, a number of switching stages and a control device, wherein the switching stages are connected to the DC voltage source, the load and the control device, such that the load can be connected to the DC voltage source on account of a corresponding driving of the switching stages by the control device, wherein the switching stages in each case have a field effect transistor and a number of freewheeling diodes reverse-connected in parallel with the respective field effect transistor, wherein the field effect transistors have a cut-off frequency up to which they can maximally be operated, wherein each freewheeling diode has a recovery time, wherein for each switching stage, the recovery times of all the freewheeling diodes reverse-connected in parallel with the respective field effect transistor at least approximately correspond to the reciprocal of the cut-off frequency of the respective field effect transistor, and wherein the control device drives the switching stages at least at times in such a way that power is reflected back into the switching stages on account of a mismatch.

In a further embodiment, no matching circuit for avoiding the mismatch is arranged between the switching stages and the load. In a further embodiment, the field effect transistors are embodied as junction field effect transistors. In a further embodiment, silicon carbide or gallium nitride is used as semiconductor material for the field effect transistors and/or the freewheeling diodes. In a further embodiment, for at least one of the switching stages, one of the freewheeling diodes reverse-connected in parallel with the respective field effect transistor is embodied, relative to the respective field effect transistor, as an externally arranged freewheeling diode. In a further embodiment, for at least one of the switching stages, one of the freewheeling diodes reverse-connected in parallel with the respective field effect transistor is integrated into the respective field effect transistor.

In a further embodiment, the switching stages are at least partly connected in parallel, and in that a power combiner is arranged between the parallel-connected switching stages and the load. In a further embodiment, the switching stages are at least partly connected in series in groups of two, and in that the groups of two are connected to the load via an outgoing point arranged between the two switching stages of the respective group of two. In a further embodiment, the switching stages are at least partly combined in pairs to form push-pull amplifiers in the manner of a circlotron. In a further embodiment, the load is connected to the DC voltage source in a pulsed fashion by the control device via the switching stages. In a further embodiment, the DC voltage source has a rectifier fed from the electrical power supply system, and in that a number of buffer capacitors are arranged between the rectifier and the switching stages. In a further embodiment, the load is embodied as a cavity resonator of a particle accelerator.

BRIEF DESCRIPTION OF THE DRAWINGS

Example embodiments will be explained in more detail below with reference to figures, in which.

DETAILED DESCRIPTION

Figure 1:
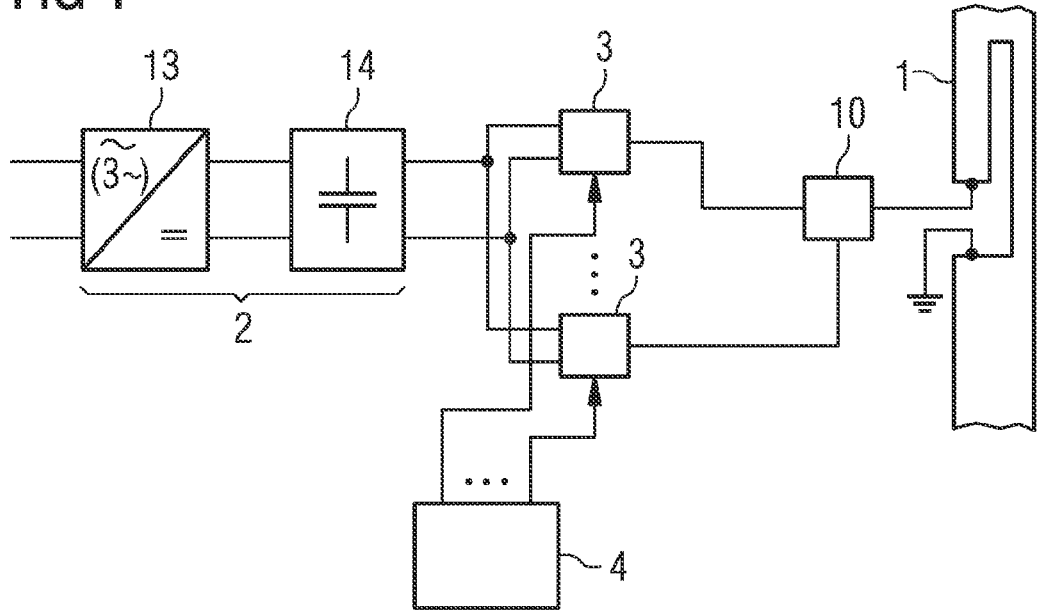
FIG. 1 shows a power supply device and a load.

Some embodiments provide a power supply device which is constructed in a simple manner and which can nevertheless be operated with a high frequency—right into the range near the cut-off frequency.

Some embodiments a power supply device of the type mentioned in the introduction by virtue of the fact that, for each switching stage, the recovery times of all the freewheeling diodes reverse-connected in parallel with the respective field effect transistor at least approximately correspond to the reciprocal of the cut-off frequency of the respective field effect transistor, and that the control device drives the switching stages at least at times in such a way that power is reflected back into the switching stages on account of a mismatch.

It may be that a matching circuit is disposed downstream of the switching stages—in the direction toward the load. In embodiments discussed herein, however, such a matching circuit for avoiding the mismatch is not absolutely necessary. It is therefore possible that no matching circuit for avoiding the mismatch is arranged between the switching stages and the load.

The field effect transistors may be embodied as junction field effect transistors (JFET). Junction field effect transistors comprise, inter alia, so-called MesFETS (MeS=metal-semiconductor). In particular, silicon carbide (SiC) and gallium nitride (GaN) are appropriate as semiconductor material.

The switching stages can be—at least partly—connected in parallel. In this case, a power combiner is generally arranged between the parallel-connected switching stages and the load.

Likewise, the switching stages can be—at least partly—connected in series in groups of two. In this case, the groups of two are connected to the load via an outgoing point arranged between the two switching stages of the respective group of two.

Likewise, the switching stages can be combined in pairs to form push-pull amplifiers in the manner of a circlotron.

It is possible that, for at least one of the switching stages, (at least) one of the freewheeling diodes reverse-connected in parallel with the respective field effect transistor is embodied, relative to the respective field effect transistor, as an externally arranged freewheeling diode. This measure is necessary if the respective field effect transistor has no integrated freewheeling diode. However, it can optionally also be realized when the respective field effect transistor has an integrated freewheeling diode.

It is likewise possible that, for at least one of the switching stages, one of the freewheeling diodes reverse-connected in parallel with the respective field effect transistor is integrated into the respective field effect transistor. An externally arranged freewheeling diode is not necessary in this case. However, it can be present.

In general, exactly one freewheeling diode will be reverse-connected in parallel with each field effect transistor. Furthermore, in general, all the switching stages will be constructed identically, that is to say either all with an external freewheeling diode or all with an integrated freewheeling diode. In principle, however, any desired mixed forms and combinations are possible.

The configuration of the power supply device as discussed herein may be advantageously particularly when the load is connected to the DC voltage source in a pulsed fashion by the control device via the switching stages.

The DC voltage source generally has a rectifier fed from the electrical power supply system. In this case, a number of buffer capacitors may be arranged between the rectifier and the switching stages.

The power supply device as discussed herein can be used, in principle, in the case of any desired loads. One example application is afforded by the fact that the load is embodied as a cavity resonator of a particle accelerator (in particular of a linear accelerator).

In accordance with FIG. 1, a power supply device for a load 1 has a DC voltage source 2, a number of switching stages 3 and a control device 4. The switching stages 3 are connected to the DC voltage source 2, the load 1 and the control device 4. As a result, the load 1 can be connected to the DC voltage source 2 on account of a corresponding driving of the switching stages 3 by the control device 4.

The number of switching stages 3 can be chosen as required. In some cases it may suffice for only a single switching stage 3 to be present. In this case, the (single) switching stage 3 may be connected up in accordance with FIG. 2.

Figure 2:
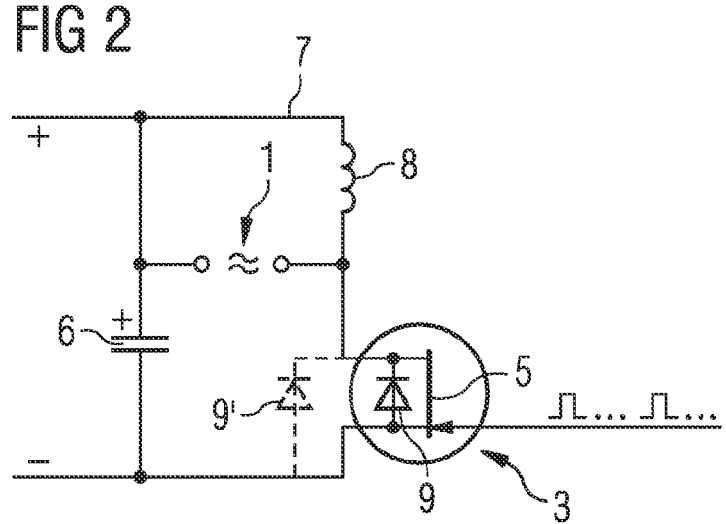
FIG. 2 shows a switching stage with circuitry.

In accordance with FIG. 2, the switching stage 3 has a field effect transistor 5. A buffer capacitor 6 is connected upstream of the field effect transistor 5 (in the direction of the DC voltage source 2). A line 7 from the DC voltage source to the field effect transistor 5 has an inductance 8. However, said inductance 8 is not an inductance provided as such, but rather an unavoidable parasitic inductance already given as such on account of the line 7. Furthermore, a freewheeling diode 9 is reverse-connected in parallel with the field effect transistor 5 internally (i.e. integrated into the field effect transistor 5). Alternatively or additionally, a freewheeling diode 9' could be reverse-connected in parallel with the field effect transistor 5 externally. The external freewheeling diode 9' is depicted by dashed lines in FIG. 2.

As an alternative to a single switching stage 3, a plurality of switching stages 3 can be present. By way of example, it is possible for a plurality of switching stages 3 to be connected in parallel in accordance with the illustration in FIG. 3. In this case, a power combiner 10 is arranged between the parallel-connected switching stages 3 and the load 1 (also see FIG. 1). The power combiner 10 can be embodied, for example, as a customary 90° or 180° hybrid.

If a plurality of switching stages 3 are connected in parallel, it is possible for the switching stages 3 to be driven simultaneously by the control device 4. Alternatively, a temporally offset—in particular staggered—driving of the switching stages 3 is possible.

Figure 4:
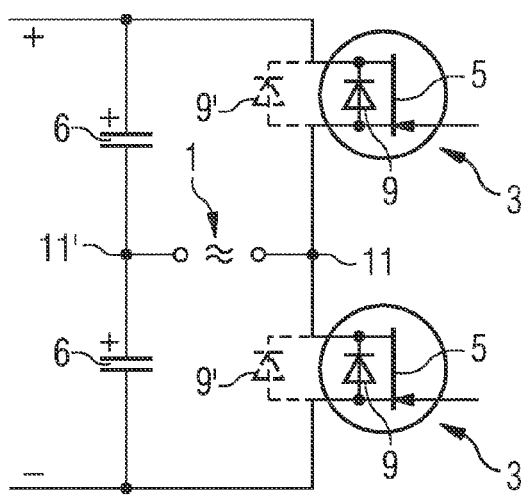

As an alternative to a parallel connection, in the case of a plurality of switching stages 3, the switching stages can be connected in series in a group of two in accordance with FIG. 4 (so-called totem pole arrangement). In this case, the group of two is connected to the load 1 via an outgoing point 11. The outgoing point 11 is arranged between the two switching stages 3 of the group of two.

In accordance with FIG. 4, a pair of buffer capacitors 6 connected in series—analogously to the switching stages 3—is furthermore present. A further outgoing point 11' is arranged between the two buffer capacitors 6, via which further outgoing point the series circuit formed by the buffer capacitors 6 is likewise connected to the load 1.

In the configuration in FIG. 4, too, the switching stages 3 each have a field effect transistor 5 with which a respective freewheeling diode 9 is reverse-connected in parallel. FIG. 4 illustrates—analogously to FIG. 2—internal freewheeling diodes 9. Analogously to FIG. 2, as an alternative or in addition to the internal freewheeling diodes 9, external freewheeling diodes 9' could be present. The external freewheeling diodes 9' are illustrated by dashed lines in FIG. 4.

Figure 3:
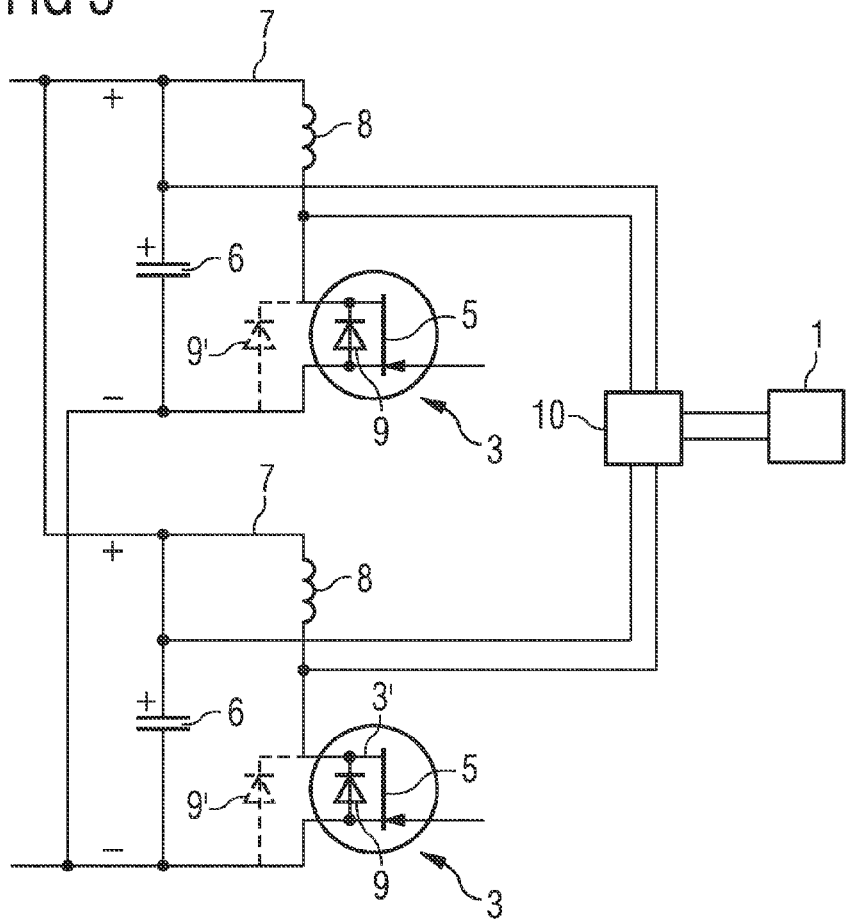
FIGS. 3 to 5 show combinations of switching stages with circuitry.

Analogously to FIG. 3, a plurality of groups of two can be present, wherein the groups of two are connected in parallel with one another. This configuration is not illustrated in the FIGS. In this case—analogously to FIG. 3—a power combiner is present, which is arranged between the outgoing points 11, 11' and the load 1. The power combiner can be embodied analogously to FIG. 3. Furthermore analogously to FIG. 3, in this case, the groups of two can be driven simultaneously or temporally offset—in particular staggered—by the control device 4.

Figure 5:
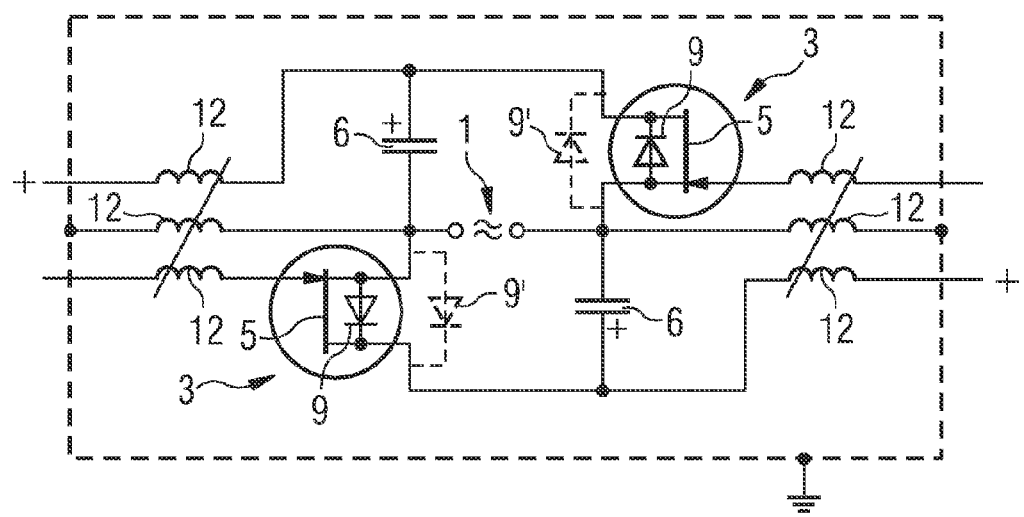

Once again as an alternative to a series connection, in accordance with FIG. 5, two switching stages 3 can be combined to form a push-pull amplifier in the manner of a circlotron. FIG. 5 shows an example configuration of such a push-pull amplifier, in which the switching stages 3 of the push-pull amplifier are connected up via (in contrast to FIG. 2: physically present) inductances 12.

In the configuration in FIG. 5, too, buffer capacitors 6 disposed upstream of the switching stages 3 are present. Furthermore, in the configuration in FIG. 5, too, the switching stages 3 have field effect transistors 5 with which freewheeling diodes 9 are reverse-connected in parallel. The freewheeling diodes 9 are embodied as internal freewheeling diodes in accordance with FIG. 5. Alternatively or additionally, external freewheeling diodes 9' could be present. The external freewheeling diodes 9' are depicted by dashed lines in FIG. 5.

Analogously to FIG. 3, it is also possible for a plurality of push-pull amplifiers to be connected in parallel with one another in the manner of a circlotron, for example such as are illustrated in FIG. 5. In this case, a power combiner is again present, which is arranged between the push-pull amplifiers and the load 1. Analogously to the explanations concerning FIG. 3, simultaneous or temporally offset (in particular staggered) operation of the push-pull amplifiers can be effected in this case.

FIG. 6 once again illustrates an individual switching stage 3 separately—that is to say without associated circuitry. The following explanations concerning FIG. 6 are applicable to each of the switching stages 3 in FIGS. 1 to 5.

Figure 6:
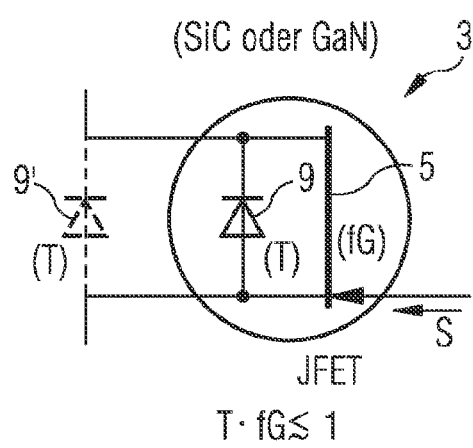
FIG. 6 shows an individual switching stage.

In accordance with FIG. 6, each field effect transistor 5 has a cut-off frequency fG. The cut-off frequency fG of the field effect transistor 5 is that frequency up to which it can maximally be operated. The respective field effect transistor can no longer switch higher frequencies. The cut-off frequency fG is defined by the fact that, in the case where the control signal S fed to the field effect transistor 5 by the control device 4 is sinusoidal and has the cut-off frequency fG, a level change in the output signal of the field effect transistor 5 corresponding to the level change in the control signal S takes place only to the extent of 63% (=1−1/e; e=Euler's number=2.718 . . . ). In this case, 100% denotes the corresponding level change in the output signal which is brought about in the case of a low-frequency, but otherwise identical change in the control signal S.

Furthermore, each diode—this also applies to the freewheeling diodes 9, 9' of the switching stage 3—has a recovery time T. The recovery time T is that time which—proceeding from the on state of the diode—elapses after the turn-off of the voltage directed in the forward direction until the pn junction of the diode 9 is depleted of charge again, that is to say the pn junction has been established again. In conventional devices, the recovery time T is usually also designated as switching time or as reverse recovery time, abbreviated to $t_{rr}$.

In some embodiments, for each switching stage 3, the field effect transistor 5 and the freewheeling diode 9 (or 9') are coordinated with one another in such a way that the recovery time T of the freewheeling diode 9, 9' at least approximately corresponds to the reciprocal of the cut-off frequency fG of the field effect transistor 5. Therefore the following relationship holds true—at least approximately $T=1/fG$ or $fG \cdot T=1$.

The abovementioned relationship holds true for all freewheeling diodes 9, 9' reverse-connected in parallel with the respective field effect transistor 5.

Small deviations from the abovementioned relationships are permissible. However, a factor of 3—better a factor of 2—should at least not be exceeded upwardly, that is to say in the direction toward longer recovery times T).

The manner in which the above relationships are fulfilled can be chosen as required. By way of example, the field effect transistors 5 in accordance with FIG. 6 can be embodied as junction field effect transistors (JFET). Junction field effect transistors comprise, inter alia, so-called MeSFETs. Junction field effect transistors have either an internal freewheeling diode 9 having extremely short recovery time T or no internal freewheeling diode at all. In the first-mentioned case, the internal freewheeling diode 9 can be used. In the second-mentioned case, a sufficiently fast external freewheeling diode 9' is used. Silicon carbide (SiC) or gallium nitride (GaN) may be used as semiconductor material for the field effect transistors 5 and/or the freewheeling diodes 9, 9'.

On account of the configuration of the switching stage 3 as described above in conjunction with FIG. 6, it is possible for the control device 4 to drive the switching stages 3 at least at times in such a way that power is reflected back into the switching stages 3 on account of a mismatch. This is because, owing to the presence of the freewheeling diodes 9, 9', the reflected power is fed back to the DC voltage side (that is to say toward the DC voltage source 2). Owing to the extremely short recovery times T of the freewheeling diodes 9, 9', there is nevertheless no risk of short-circuit operation of the freewheeling diodes 9, 9', which would lead to destruction of the power supply device.

The power can be reflected back from the load 1, for example. One possible cause of such power reflection is that a matching circuit that would serve for avoiding such power reflection is not arranged between the switching stages 3 and the load 1. Alternatively, such a matching circuit can indeed be present. In this case, reflection of power can nevertheless occur particularly then in some operating states of the load 1. Alternatively or additionally, in the case of the presence of a power combiner—for example the power combiner 10 from FIG. 3—power can be reflected there. Here, too, the power reflection can have the same causes—that is to say the absence of a matching circuit or the incomplete effect of the matching circuit in some operating states.

The case where power is reflected back into the switching stages 3 despite the presence of a matching circuit can occur particularly when the load 1 is connected to the DC voltage source 2 in a pulsed fashion by the control device 4 via the switching stages 3. The pulsed connection is indicated symbolically in FIG. 2. It goes without saying, however, that the pulsed connection is also possible in the configurations in FIGS. 3, 4 and 5 and also in the case of the parallel connection of a plurality of groups of two and the parallel connection of a plurality of push-pull amplifiers in the manner of a circlotron.

The DC voltage source 2 can be embodied as required. In general, in accordance with FIG. 1, the DC voltage source 2 has a rectifier 13 fed by the electrical power supply system. Furthermore, in general, a number of buffer capacitors 14 are arranged between the rectifier 13 and the switching stages 3. The buffer capacitors 14, which are connected directly downstream of the rectifier 13 fed by the electrical power supply system, can be identical to the buffer capacitors 6 in FIGS. 2 to 5. Alternatively, additional capacitors can be involved.

The load 1 can likewise be embodied as required. In accordance with FIG. 1, the load 1 is embodied as a cavity resonator of a particle accelerator (in particular of a linear accelerator).

Embodiments of the present invention may provide various advantages. For example, the power supply device can be produced with high power density and high total power.

The above description serves exclusively for elucidating the present invention. By contrast, the scope of protection of the present invention is intended to be determined exclusively by the accompanying claims.

LIST OF REFERENCE SYMBOLS

1 Load
2 DC voltage source
3 Switching stages
4 Control device
5 Field effect transistors
6, 14 Buffer capacitors
7 Line
8, 12 Inductances
9, 9' Freewheeling diodes
10 Power combiner
11, 11' Outgoing points
13 Rectifier
fG Cut-off frequency
S Control signal
T Recovery time

The invention claimed is:
1. A power supply device for a load, comprising:
a DC voltage source,
a number of switching stages, and
a control device,
wherein the switching stages are connected to the DC voltage source, the load and the control device, and
wherein the control device is configured to selectively drive the respective switching stages to dynamically connect the load to the DC voltage source via one or more of the switching stages selectively driven by the control device,
wherein each of the switching stages has a field effect transistor and a number of freewheeling diodes that are reverse-connected in parallel with the respective field effect transistor,
wherein the field effect transistors have a maximum operational cut-off frequency,
wherein each freewheeling diode is configured with a selected recovery time,
wherein for each of the switching stages, the recovery times of all the freewheeling diodes reverse-connected in parallel with the respective field effect transistor at least approximately correspond to the reciprocal of the cut-off frequency of the respective field effect transistor, and
wherein the control device is configured to drive the switching stages at least at times such that power is reflected back into the switching stages due to a mismatch.

2. The power supply device as claimed in claim 1, wherein no matching circuit for avoiding the mismatch is arranged between the switching stages and the load.

3. The power supply device of claim 1, wherein the field effect transistors comprise junction field effect transistors.

4. The power supply device of claim 1, wherein silicon carbide or gallium nitride is used as semiconductor material for at least one of the field effect transistors and the freewheeling diodes.

5. The power supply device of claim 1, wherein, for at least one of the switching stages, one of the freewheeling diodes reverse-connected in parallel with the respective field effect transistor is embodied, relative to the respective field effect transistor, as an externally arranged freewheeling diode.

6. The power supply device of claim 1, wherein, for at least one of the switching stages, one of the freewheeling diodes reverse-connected in parallel with the respective field effect transistor is integrated into the respective field effect transistor.

7. The power supply device of claim 1, wherein:
the switching stages are at least partly connected in parallel, and
a power combiner is arranged between the parallel-connected switching stages and the load.

8. The power supply device of claim 1, wherein:
the switching stages are at least partly connected in series in groups of two, and
the groups of two are connected to the load via an outgoing point arranged between the two switching stages of the respective group of two.

9. The power supply device of claim 1, wherein the switching stages are at least partly combined in pairs to form push-pull amplifiers in the manner of a circlotron.

10. The power supply device of claim 1, wherein the load is connected to the DC voltage source in a pulsed fashion by the control device via the switching stages.

11. The power supply device of claim 1, wherein:
the DC voltage source has a rectifier fed from the electrical power supply system, and
a number of buffer capacitors are arranged between the rectifier and the switching stages.

12. The power supply device of claim 1, wherein the load is embodied as a cavity resonator of a particle accelerator.

* * * * *